United States Patent
Moskovits et al.

[11] Patent Number: 5,824,368
[45] Date of Patent: Oct. 20, 1998

[54] PROCESS OF DIAMOND GROWTH FROM $C_{70}$

[76] Inventors: Martin Moskovits, 145 Chiltern Hill Rd., Toronto Ontario, Canada, M6C 3C3; Kejian Fu, 30 Tannery St. #210, Mississanga Ontario, Canada, L5M 6B7

[21] Appl. No.: 828,148

[22] Filed: Mar. 24, 1997

Related U.S. Application Data

[63] Continuation-in-part of Ser. No. 391,705, Feb. 21, 1995, Pat. No. 5,614,258.
[51] Int. Cl.⁶ .............. C23C 16/26; C01B 31/06
[52] U.S. Cl. .............. 427/249; 423/446
[58] Field of Search .............. 427/249; 117/929; 423/446

[56] References Cited

U.S. PATENT DOCUMENTS

| | | |
|---|---|---|
| 5,209,916 | 5/1993 | Gruen . |
| 5,328,676 | 7/1994 | Gruen . |
| 5,370,855 | 12/1994 | Gruen . |
| 5,462,776 | 10/1995 | Gruen . |

FOREIGN PATENT DOCUMENTS

| | | |
|---|---|---|
| 9311068 | 6/1993 | WIPO . |
| 9421557 | 9/1994 | WIPO . |

OTHER PUBLICATIONS

Chrushing $C_{60}$ to Diamond at Room Temperature Manuel Nunez Regueiro et al. *Nature* vol. 355, pp. 237–239, 16 Jan. 1992.

Diamond from Fullerenes: Evidence from Raman Measurements M. Nunez Regueiro et al. *Physical Review B* vol. 46, No. 15, pp. 9903–9905, 15 Oct. 1992.

Quenching a Transition of $C_{60}$ Fullerene to Diamond Under Shock Compression Hisako Hirai, et al. *Carbon* vol. 3, No. 7, pp. 1095–1098, 11 Jan. 1993.

Nucleation of Diamond Films on Surfaces Using Carbon Clusters R. J. Meilunas et al. *American Institute of Physics* vol. 59, pp. 3461–3463 23 Dec. 1991.

Activated $C_{70}$ and Diamond R. J. Meilunas et al. *Nature* vol. 354, p. 271, 28 Nov. 1991.

Buckyball Microwave Plasmas: Fragmentation and Diamond–Film Growth Dieter M. Gruen et al. *J. Appl. Phys.* vol. 75, No. 3, pp. 1758–1763, 1 Feb. 1994.

Fullerenes as Precursors for Diamond Film Growth without Hydrogen or Oxygen Additions Dieter M. Gruen et al. *Appl. Phys. Lett.* vol. 64, No. 12, pp. 1502–1504, 21 Mar. 1994.

Effect of Explosion Conditions on the Structure of Detonation Soots: Ultradisperse Diamond and Onion Carbon V. L. Kuznetsov et al. *Carbon* vol. 32, No. 5, pp. 873–882, 1 Nov. 1993.

Onion–Like Carbon from Ultra–Disperse Diamond V. L. Kuznetsov et al. *Chemical Physics Letters* vol. 222, pp. 343–348, 20 May 1994.

Carbon Fibers Based on $C_{60}$ and their Symmetry M. S. Dresselhaus et al. *Physical Review B* vol. 45, No. 11, pp. 6234–6237, 24 Sep. 1991.

Role of $sp^3$ and Carbon and 7–Membered Rings In Fullerene Annealing and Fragmentation Robert L. Murry et al. *Nature* vol. 366, pp. 665–667, 16 Dec. 1993.

Vibrational Mode Frequencies in $C_{70}$ R. A. Jishi et al. *Chemical Physics Letters* vol. 206, No. 1, 2, 3, 4, pp. 187–191, 30 Apr. 1993.

*Primary Examiner*—Roy V. King
*Attorney, Agent, or Firm*—Lynn C. Schumacher; Hill & Schumacher

[57] ABSTRACT

A method of growing single crystal diamonds in excess of 10 $\mu$m in diameter from industrial diamond "seeds" having mean diameters of approximately 1.5 $\mu$m is disclosed. The diamonds are grown by exposing the seed diamonds to $C_{70}$ in the presence of elemental reducing agents such as phosphorus or selenium in evacuated cells at moderate temperatures and pressures. In another aspect the invention diamonds are grown by exposing diamond seed particles to vapour phase $C_{70}$ in the presence of a gas phase metal carbonyl, such as $F_5e(CO)$ in a temperature range of 400° C. to 700° C. to cause at least some of the diamond seed particles to grow.

16 Claims, 10 Drawing Sheets

PROCESS OF DIAMOND GROWTH FROM $C_{70}$

This patent application is a continuation-in-part application of U.S. patent application Ser. No. 08/391,705 filed on Feb. 21, 1995, which will issue to U.S. Pat. No. 5,614,258 on Mar. 25, 1997.

FIELD OF THE INVENTION

The present invention relates to a method of growing diamonds by reduction of $C_{70}$ Buckminster fullerenes in the presence of diamond seed particles.

BACKGROUND OF THE INVENTION

Diamond, being the hardest substance known, is of great commercial and scientific value. It is inert to chemical corrosion and can withstand compressive forces and radiation. It is an electrical insulator having extremely high electrical resistance but is an excellent thermal conductor, conducting heat better than most other electrical insulators. Diamond is structurally similar to silicon but is a wide-band-gap semiconductor (5 eV) and so is transparent to UV-visible light and to much of the infrared spectrum. It has an unusually high breakdown voltage and low dielectric constant. These properties, coupled with recent advances, have led to speculation that diamond might find widespread application in high speed electronic devices and devices designed to be operated at high temperature. If it can be doped successfully diamond could become an important semiconductor material on which new or replacement device applications may be based. While silicon chips can withstand temperatures up to 300° C., it is estimated that diamond devices may be able to withstand considerably higher temperatures. Diamond film already find applications as hard protective coatings.

Because of these useful properties, synthetic diamond has great potential in research and commercial applications. Synthetic diamonds are now produced by two known methods: a high pressure process in which carbonaceous material is compressed into diamond using high pressure anvils; and the more recent technique of chemical vapour deposition (CVD) in which diamond films are deposited on an appropriate substrate by decomposing a carbon containing gaseous precursor.

Of recent particular scientific interest are a class of carbon structures known as Buckminster fullerenes which are formed by an integral number of carbon atoms which combine to form a closed, roughly spherical structure. Two prominent fullerenes are $C_{60}$ and $C_{70}$, which are spherical structures comprising 60 and 70 carbon atoms, respectively. The successful transformation of $C_{60}$ and $C_{70}$ into diamond at high pressure has been disclosed by Manuel Nunez Regueiro, Pierre Monceau, Jean-Louis Hodeau, *Nature*, 355, 237–239 (1992) and Manuel Nunez Regueiro, L. Abello, G. Lucazeau, J. L. Hodeau, *Phys. Rev. B*, 46, 9903–9905 (1992). The transition of $C_{60}$ to diamond has also been studied by Hisako Hirai, Ken-ichi Kondo and Takeshi Ohwada, *Carbon*, 31, 1095–1098 (1993). It is also known that $C_{70}$ can accelerate the nucleation of diamond thin film formation on metal surfaces using CVD as disclosed by R. J. Meilunas, R. P. H. Chang, S. Liu, M. M. Kappes, *Appl. Phys. Lett.*, 59, 3461–3463 (1991), and R. J. Meilunas, R. P. H. Chang, S. Liu, M. M. Kappes, *Nature*, 354, 271 (1991).

A high growth rate of diamond film using fullerene precursors in an argon microwave plasma with or without hydrogen has been reported by D. M. Gruen, S. Liu, A. R. Krauss and X. Pan, *J. Appl. Phys.*, 75,1758–1763 (1994), and D. M. Gruen, S. Liu, A. R. Krauss, J. Luo and X. Pan, *Appl. Phys. Lett.*, 64, 1502–1504 (1994).

Recently, dispersed diamond particles with diameters in the range of 20–150 Å have been observed in fullerene-rich soot as disclosed by Vladimir Kuznetsov, A. L. Chuvilin, E. M. Moroz, V. N. Kolomiichuk, Sh. K. Shaikhutdinov, Yu. V. Butenko, *Carbon*, 32, 873–882 (1994), and Vladimir L. Kuznetsov, Andrey L. Chuvilin, Yuri V. Butenko, Igor Yu. Malkov, Vladimir M. Titov, *Chem. Phys. Lett.*, 222, 343–348 (1994).

U.S. Pat. Nos. 5,370,855, 5,462,776, 5,328,676 and 5,209,916 issued to Gruen disclose methods of conversion of fullerenes to diamond. The methods comprise subjecting the fullerenes to highly energetic environments such as radio frequency plasma discharges, electron beams, intense laser beams to break down potassium modified fullerenes. Growth of diamond onto diamond seed substrates heated to 1000° to 1200° C. is disclosed in U.S. Pat. No. 5,462,776. A drawback to all these methods of fullerene conversion is the fact that at such high temperatures the diamond structure is prone to conversion to graphite. Another drawback is the expense of the energy imparting devices such as lasers, RF generators and the like.

It would be very advantageous and of potentially significant commercial value to be able to grow single crystal diamond particles with much larger particle sizes at relatively low temperatures in an environment not requiring capital intensive equipment.

SUMMARY OF THE INVENTION

It is an object of the present invention to provide an economical process for growing single crystal diamonds which does not require high temperatures or pressures.

The present invention provides a process for the formation of diamond particles of mean diameters in excess of $4.0 \times 10^{-4}$ m, grown from diamond powder nucleation seeds of approximately $1.5 \times 10^{-6}$ m mean diameter. $C_{70}$ is reduced in the presence of reducing agents such as selenium or phosphorous at moderate temperatures and pressure.

In one aspect of the invention there is provided a process for growing diamonds comprising exposing diamond seed particles to vapour phase $C_{70}$ in the presence of an element selected from the group consisting of selenium and phosphorous at a temperature of at least 550° C. to cause at least some of the diamond seed particles to grow.

In another aspect of the invention there is provided a process for growing diamonds. The process comprises providing a plurality of diamond seed particles; providing a quantity of $C_{70}$ powder and an element selected from the group consisting of selenium and phosphorous, the $C_{70}$ and powder and the element being in flow communication with the diamond seed particles; and heating the $C_{70}$ powder to produce $C_{70}$ powder in vapour phase, and heating the element and the diamond seed particles at a temperature of at least 500° C. and for a period of time of from 18 days to 60 days to cause at least some of the diamond seed particles to grow.

In another aspect of the invention there is provided a process for growing diamonds. The process comprises providing a plurality of diamond seed particles having a mean diameter and providing a quantity of $C_{70}$ powder and a reducing agent. The $C_{70}$ powder and the reducing agent are in flow communication with the diamond seed particles. The process includes the step of heating the $C_{70}$ powder to produce $C_{70}$ in the vapour phase, and heating the reducing agent and the diamond seed particles under vacuum at a temperature of from about 500° C. to about 600° C. and for a period of time of from about 18 days to about 60 days to cause a portion of the $C_{70}$ in the vapour phase to be reduced by the reducing agent and deposit onto and increase the mean diameter of at least one of the diamond seed particles.

The present invention also provides a process for growing diamonds comprising exposing diamond seed particles to vapour phase $C_{70}$ in the presence of a gas phase metal carbonyl at an effective temperature to cause at least some of the diamond seed particles to grow. The gas phase metal carbonyl is preferably on of the iron carbonyls and most preferably iron penta-carbonyl.

The invention also provides a process for growing diamonds comprising exposing diamond seed particles to vapour phase $C_{70}$ in the presence of a gas phase catalyst comprising at least CO constituent at an effective temperature to cause at least some of the diamond seed particles to grow. The catalyst is preferably $Fe(CO)_5$.

In another aspect the present invention provides a process for growing diamonds comprising exposing said diamond seed particles to vapour phase $C_{70}$ in the presence of a gas phase iron carbonyl at a temperature in the range from about 570° C. to about 600° C. to cause at least some of the diamond seed particles to grow. The iron carbonyl is preferably $Fe(CO)_5$.

BRIEF DESCRIPTION OF THE DRAWINGS

The method of diamond growth from $C_{70}$ forming the subject invention will now be described, reference being had to the accompanying drawings, in which.

DETAILED DESCRIPTION OF THE INVENTION

Figure 1:
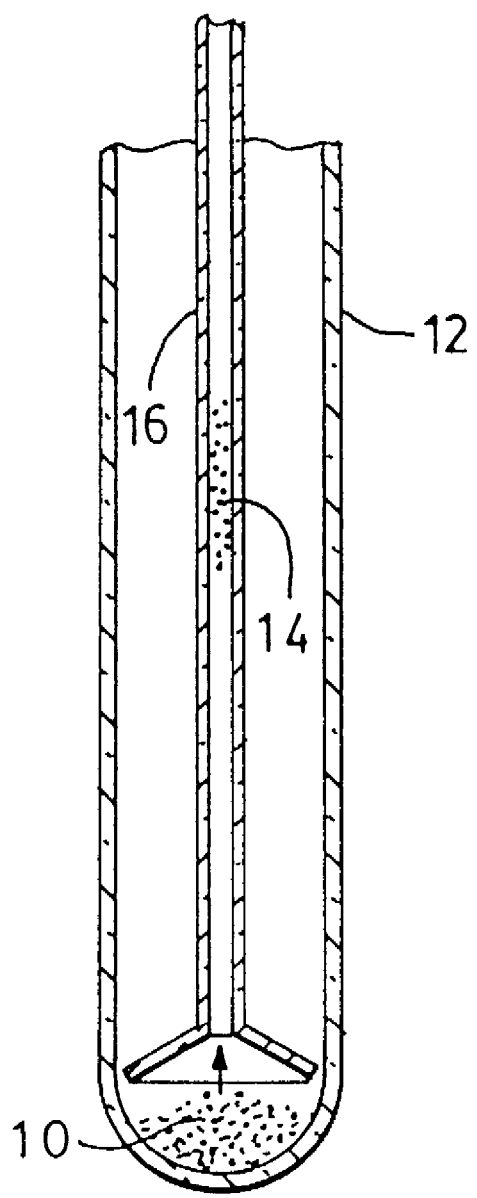
FIG. 1 illustrates an apparatus used for growing diamonds from diamond seeds according to the present invention.

Referring to FIG. 1, approximately 18 to 20 mg of $C_{70}$ (98%), approximately 11 mg of elemental selenium powder (99.5%, −325 Mesh particle size, Alfa) or red phosphorous powder (99%, −100 Mesh particle size, Alfa) and trace quantities of diamond seed powder (average diameter of $1.5 \times 10^{-6}$ m) were placed generally at 10 in a 1 cm diameter× 10 cm long pyrex tube 12. A trace quantity (<1 mg) of diamond powder shown generally at 14 was loaded into a small pyrex capillary (1.0 mm×50 mm) 16, which was then set into the larger pyrex tube 12 as shown in FIG. 1. The entire tube assembly was evacuated and sealed under vacuum of approximately $2.66 \times 10^{-2}$ Pascals ($\sim 2 \times 10^{-5}$ torr). After heating the tube assembly at a temperature of about 550° C. in a tube oven (not shown) with controllable temperature for 20 to 30 days, various portions of the product were examined using laser micro-Raman Spectroscopy and scanning electron microscopy (SEM).

Crystallite sizes and shapes of the diamond seeds and the reaction produces were examined using scanning electron microscopy (HITACHI model S-570, Japan). The identification of the crystallites as diamond was accomplished using Laser micro-Raman spectroscopy. An important advantage of micro-Raman spectroscopy is that the sample crystallite can be located by a charge coupled device (CCD) camera at high magnification. This enabled both the size of the crystallite and its identity to be determined simultaneously. A Kr ion laser tuned to 530.87 nm was used as the excitation source. An approximately 2 mW beam was focused down to a 3 micrometer diameter spot. Raman spectra were detected in a back scattering geometry using a triplemate spectrometer (SPEX Industries Inc. model 1877D) equipped with a microscope (Micromate model 1482D) and a liquid nitrogen cooled CCD detector (Princeton Instruments Inc. Model LN/CCD).

Figure 2:
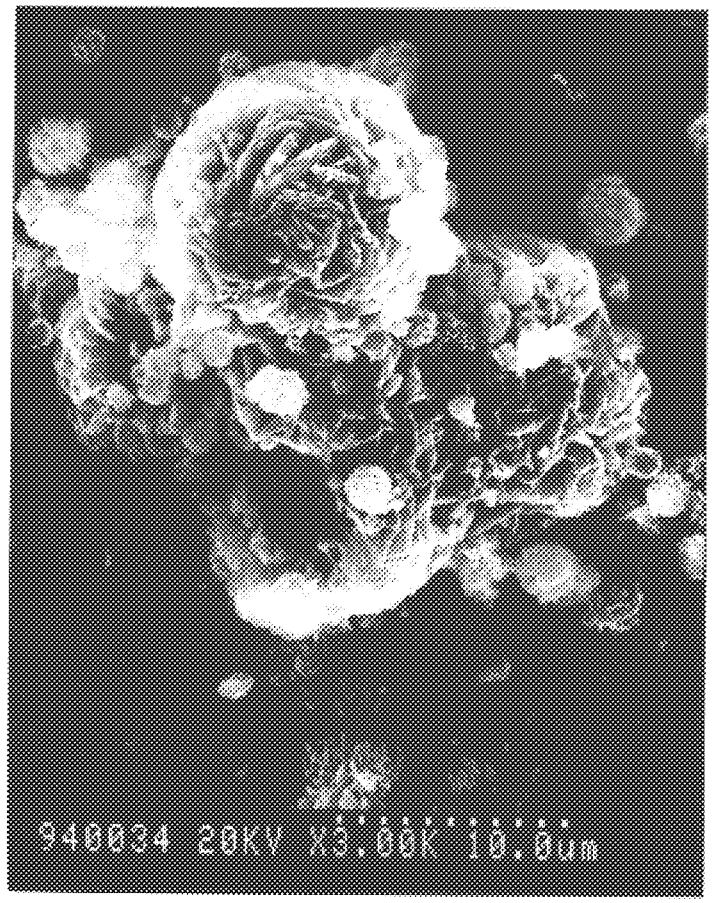
FIG. 2 is a scanning electron micrograph (SEM) of $C_{70}$ polycrystalline powder used in the method according to the present invention.
Figure 3:
FIG. 3 is an SEM of a sample of the diamond seeds (average size ~1.5 $\mu$m) used in the method of the present invention.
Figure 4:
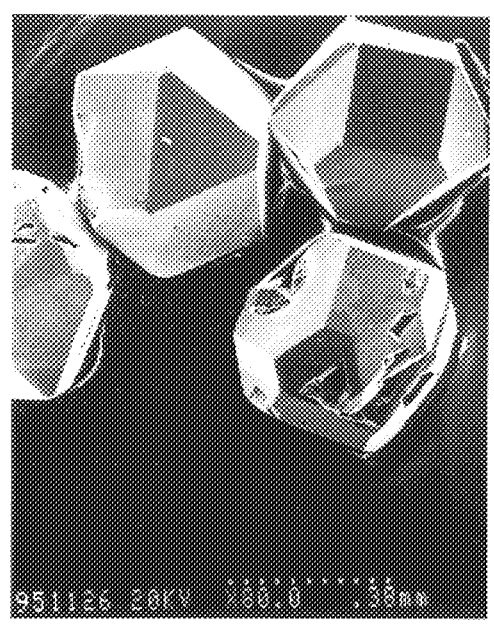
FIG. 4 is an SEM of several diamond particles found in the lower portion of the capillary shown in FIG. 1 after the assembly was heated at 550° C. for 20 days in the presence of selenium.

An SEM image of the $C_{70}$ powder that was used in the above-described experiment is shown in FIG. 2. The plate-like crystallites are shown for the purpose of comparison with diamond crystallites. FIG. 3 shows an SEM image of a sample of the diamond powder that was used as seed diamond. Examination of several such samples showed that particle diameters rarely exceeded $2 \times 10^{-6}$ m and no particle with a diameter in excess of $3 \times 10^{-6}$ m was seen. In contrast, FIG. 4 shows four crystallites with average diameters of approximately 400 $\mu$m that were found among the reaction products of the fullerene seeded with small diamond particles and with selenium used as the reducing or reacting agent after 20 days of heating at 550° C. Only approximately 1% of the diamond seeds were found to be enlarged to this extent. However, on a volume basis the overall enlargement of the individual seeds was substantial.

Figure 5:
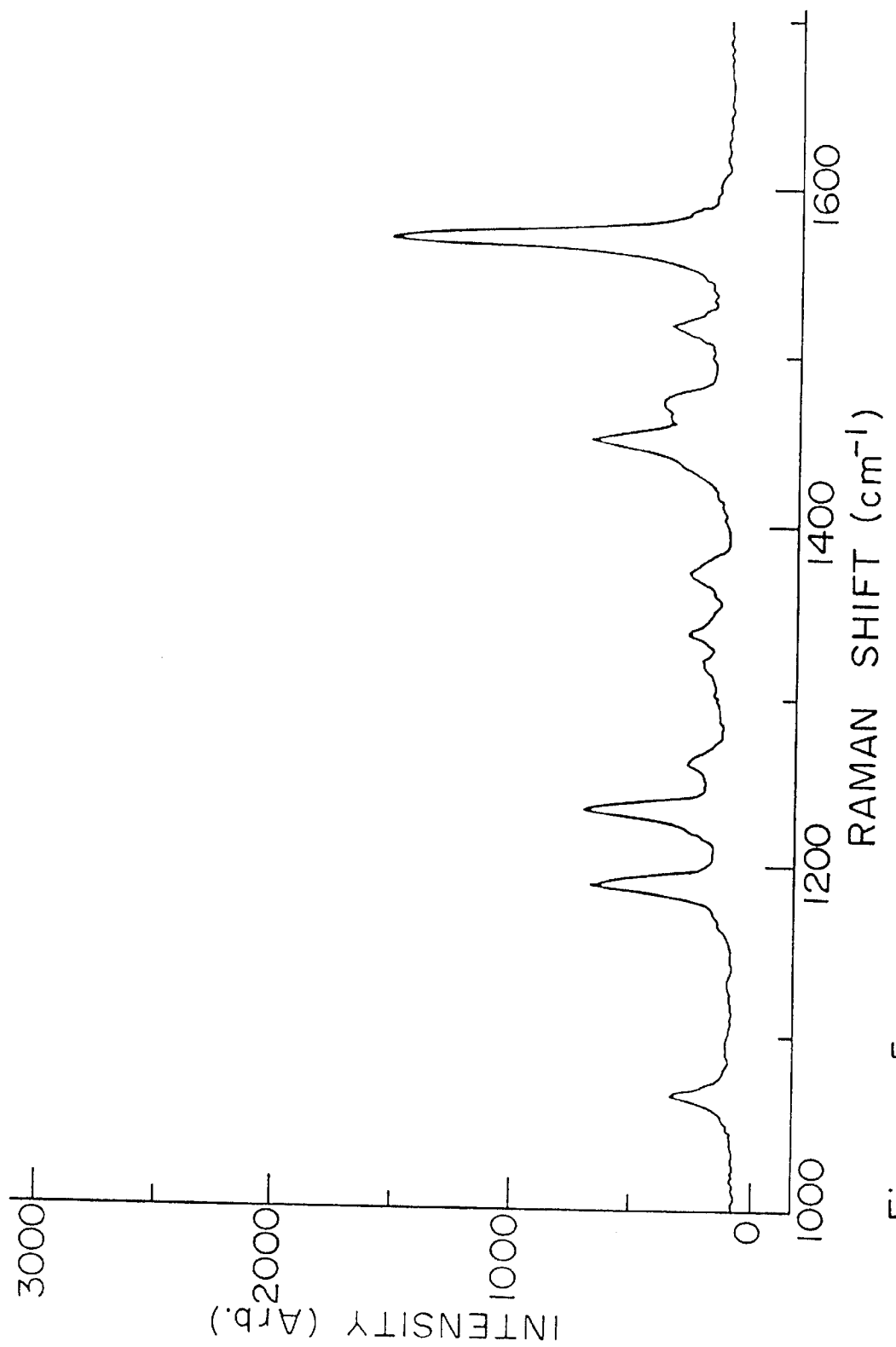
FIG. 5 displays a typical laser micro-Raman spectrum of the $C_{70}$ polycrystalline powder of FIG. 2.
Figure 6:
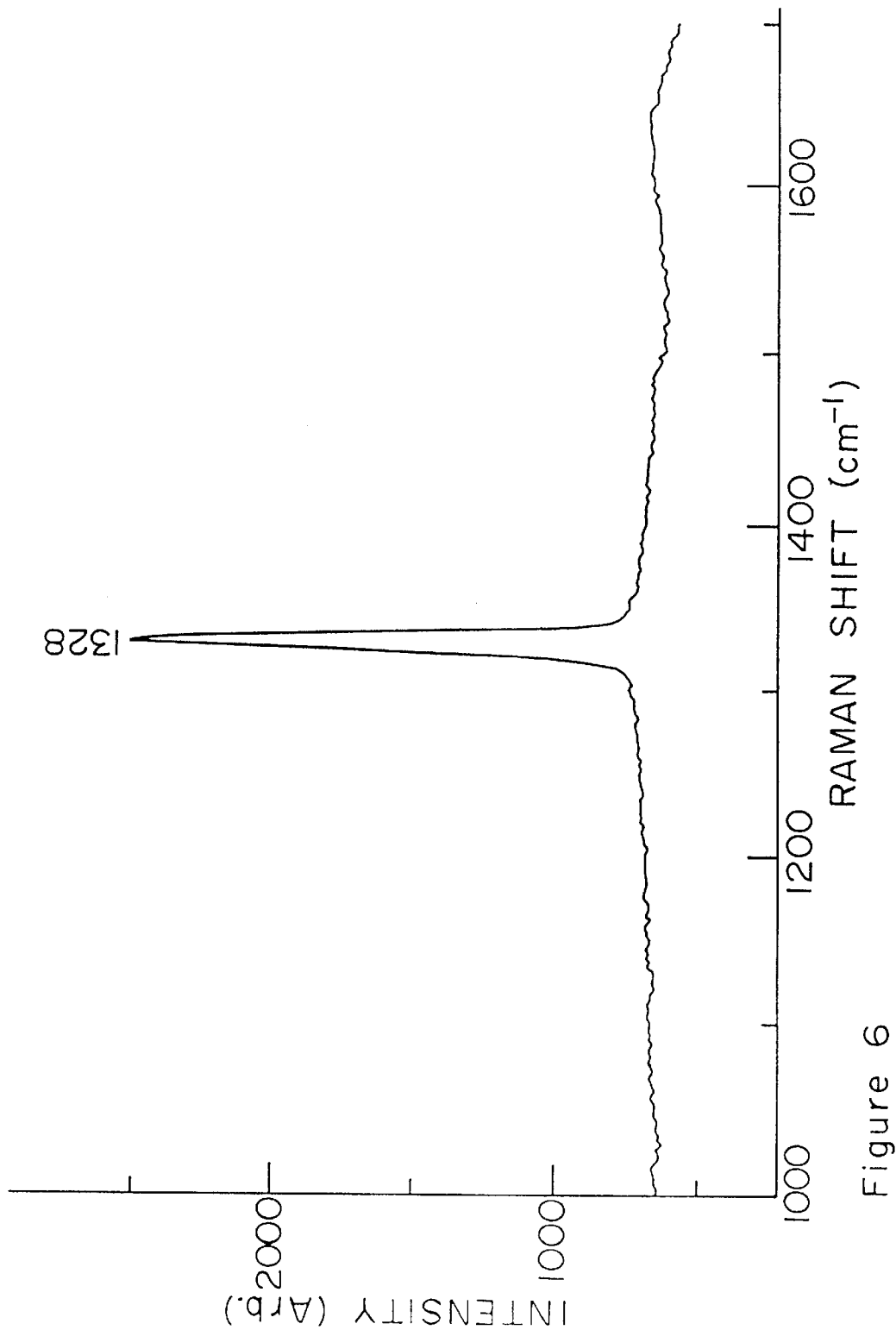
FIG. 6 displays a laser micro-Raman spectrum of one of the particles shown in FIG. 4 in the wavelength range 1000 to about 1700 $cm^{-1}$.
Figure 7:
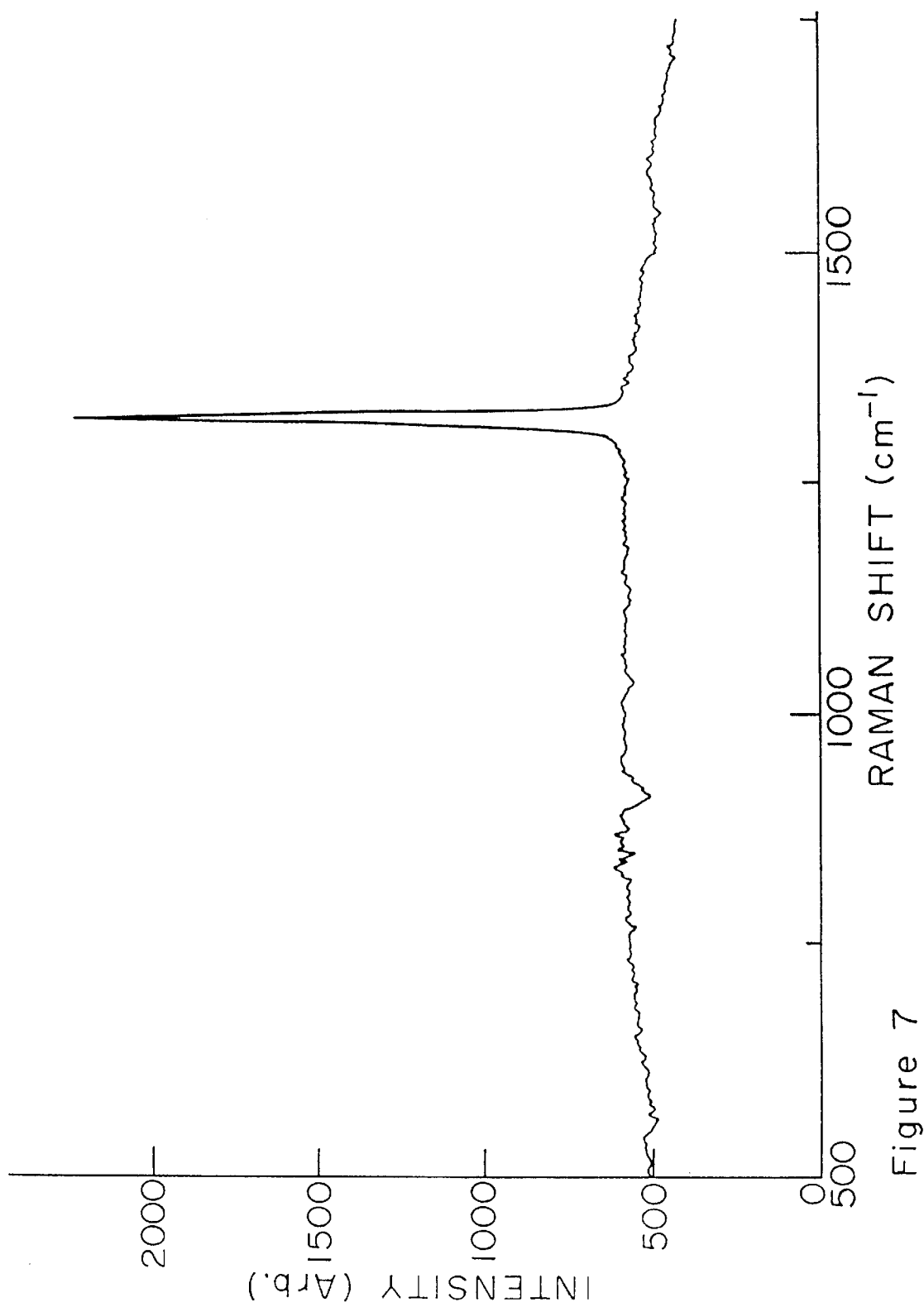
FIG. 7 displays a laser micro-Raman spectrum of one of the particles shown in FIG. 4 in the wavelength range 500 to about 1700 $cm^{-1}$.

The micro-Raman spectrum of one of these crystallites is shown in FIG. 6 over the wavelength range 1000 to about 1700 $cm^{-1}$. The characteristic single peak at approximately 1328 $cm^{-1}$ is unequivocal proof that the particle is diamond. The micro-Raman spectrum shown in FIG. 7 is similar to the spectrum of FIG. 6 but was taken in the wavelength range 500 to about 1700 $cm^{-1}$. For comparison, the Raman spectrum of $C_{70}$ that was used in this work is shown in FIG. 5. There is no such peak at 1328 $cm^{-1}$. The 26 relatively strong vibrational mode frequencies obtained from the spectrum of FIG. 5 are in good agreement with values previously disclosed in R. A. Jishi, M. S. Dresselhaus, G. Dresselhaus, Kai-An Wang, Ping Zhou, A. M. Rao and P. C. Eklund, Chem. Phys. Lett., 206, 187 (1993). These vibrational mode frequencies are also in good agreement with group theoretical analysis, see M. S. Dresselhaus, G. Dresselhaus and R. Saito, Phys. Rev. B, 45, 6234 (1992). In all $C_{70}$ has 53 Raman active modes.

Figure 8:
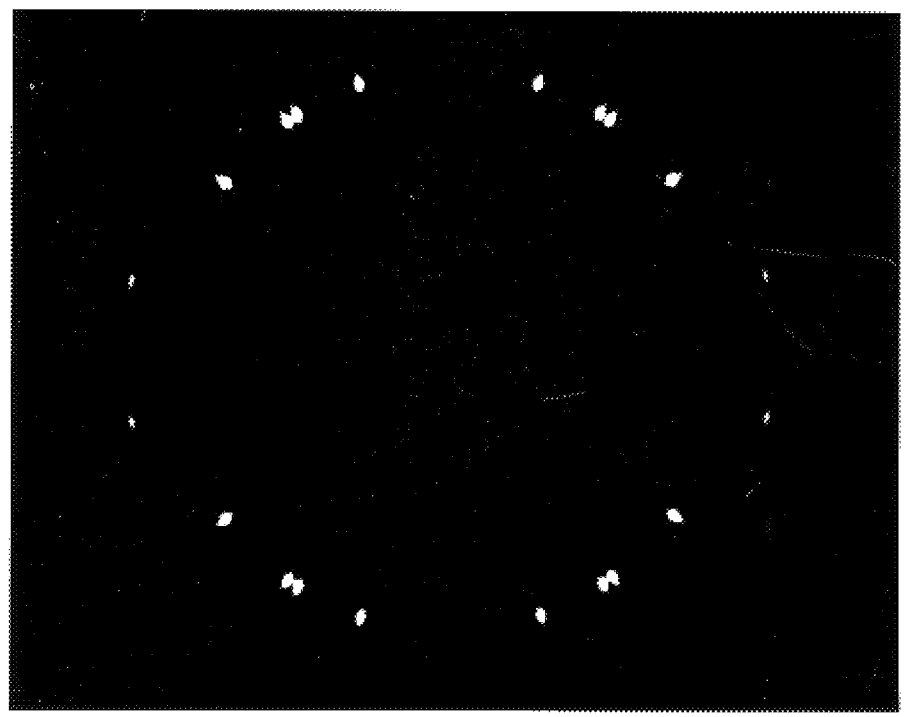
FIG. 8 is shows the x-ray diffraction of one of the grown diamond particles shown in FIG. 4.
Figure 9:
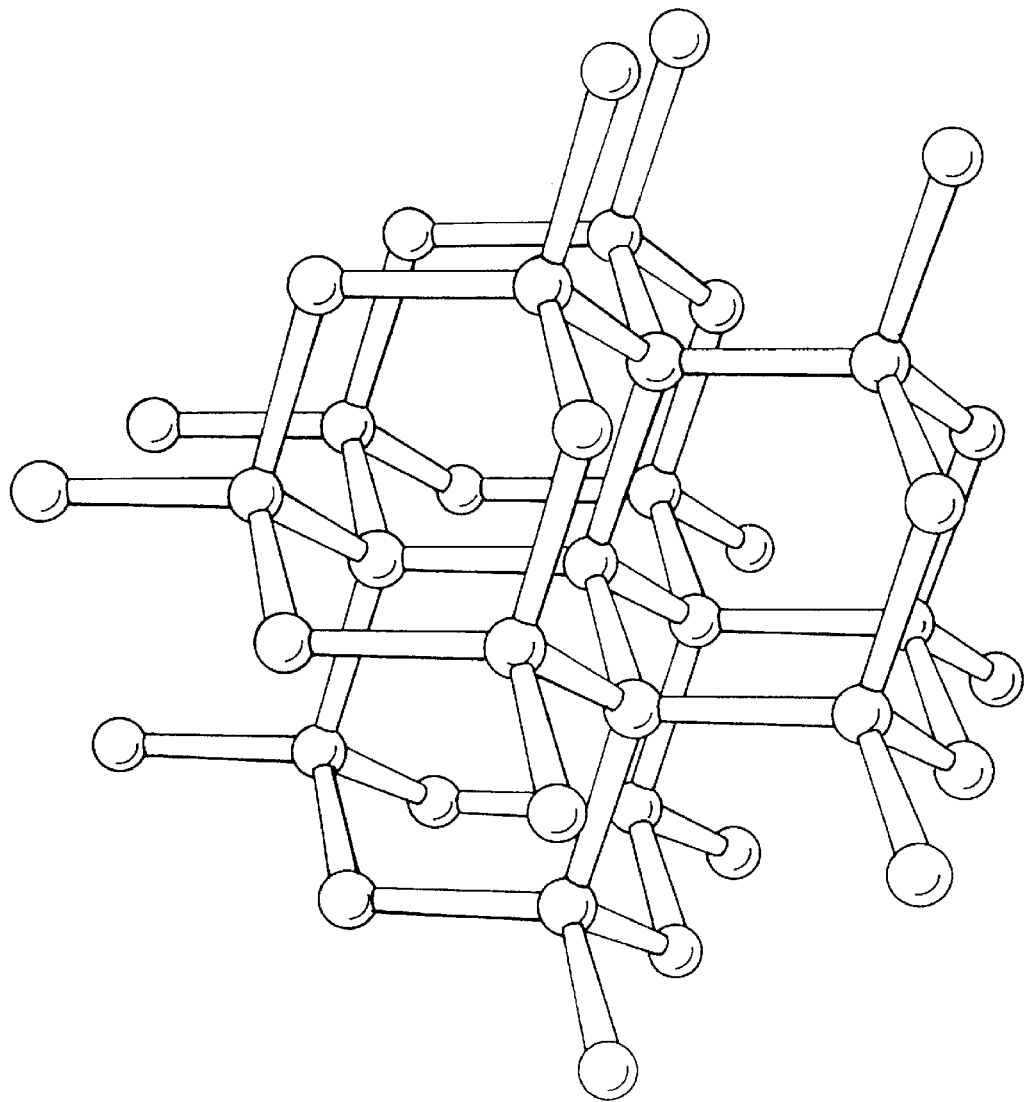
FIG. 9 shows the structure of a diamond particle grown according to the method of the present invention calculated from the x-ray diffraction pattern of FIG. 8.

The x-ray diffraction pattern shown in FIG. 8 for one of the grown diamond particles in FIG. 4 clearly shows the single crystal cubic structure of diamond and this is confirmed from the crystal structure shown in FIG. 9 calculated from the x-ray diffraction pattern of FIG. 8.

Most of the larger diamond particles that were produced were found in the capillary 16 (FIG. 1) in which the seed diamonds were deposited. This strongly suggests that gas-phase $C_{70}$ was responsible for the growth of the seed diamonds. $C_{70}$ has a substantial vapour pressure at 550° C. The Raman spectrum of the material that remained at the bottom of the larger tube 10 after 20 days corresponded to that of unreacted $C_{70}$.

Analogous experiments were also conducted using $C_{60}$ instead of $C_{70}$. These experiments using $C_{60}$ did not produce any measurable growth in the size of the diamond seed particles based on comparison of SEMs taken before and after prolonged exposure of the seeds to $C_{60}$ under essentially the same conditions of temperature, pressure and time as with the $C_{70}$.

In addition to selenium and phosphorous, other elemental reducing agents such as sodium, potassium and sulphur are contemplated by the inventors to be effective in reducing $C_{70}$ and at temperatures higher than in the range 500° to 600° C.

Figure 10:
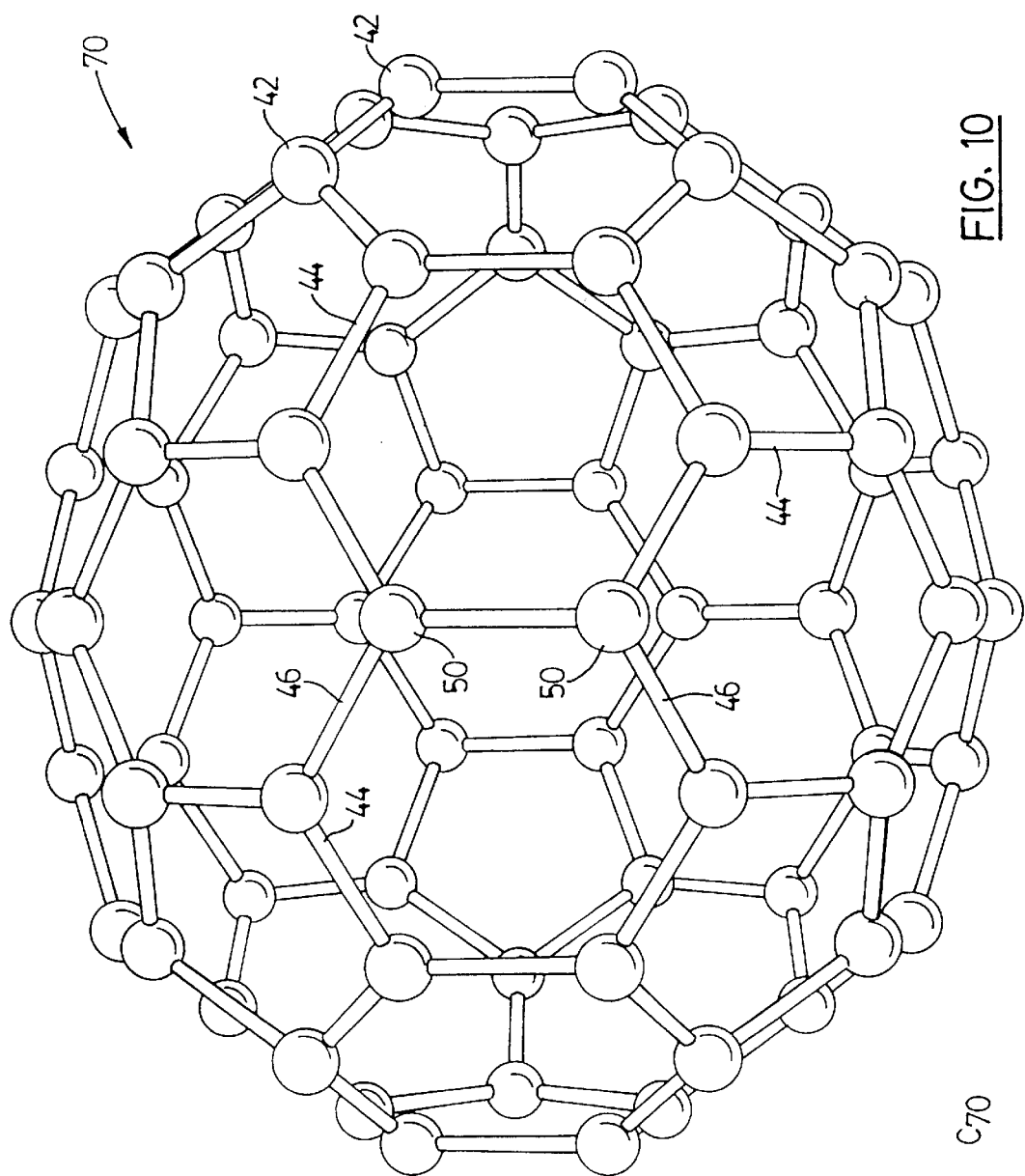
FIG. 10 shows the structure of $C_{70}$.
Figure 11:
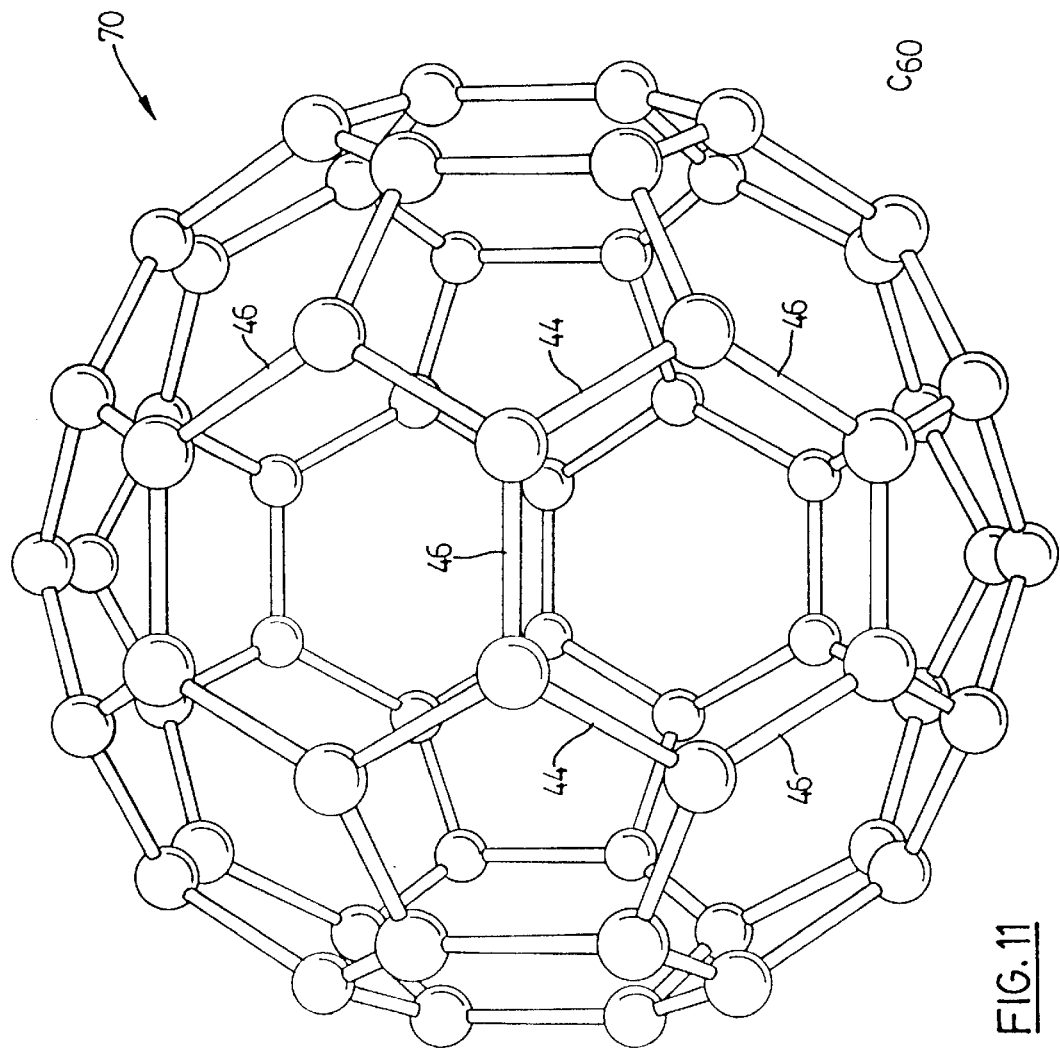
FIG. 11 shows the structure of $C_{60}$.

The following is a possible growth mechanism proposed by the inventors. The mechanism is speculative, so it will be understood that the following is meant to be a non-limiting explanation. The structure of $C_{70}$ is shown generally at 40 in FIG. 10 and can be compared to the structure of $C_{60}$ shown at 70 in FIG. 11. The carbon atoms 42 comprising $C_{70}$ are hybridized intermediately between $sp^2$ (as in graphite) and $sp^3$, the hybridization of carbon in diamond. When one of the bonds is broken in a fullerene, the two carbons comprising the broken bond have a choice between $sp^2$ and $sp^3$ hybridization according to the nature of the reaction partner that reacts at the broken bond. Referring to FIG. 11, $C_{60}$ has two types of C—C bonds; a so-called "single bond" 44 at the edges between pentagonal and hexagonal faces, and a "double bond" 46 at the edges between hexagonal faces. However, all carbon atoms are vertices of both hexagonal and pentagonal faces. Referring to FIG. 10, $C_{70}$ has, additionally, C—C bonds 50 that are edges separating two hexagonal faces and, also, vertices of hexagonal faces only. The inventors speculate that it is these additional carbon-carbon bonds 50 in $C_{70}$ that break to initiate diamond growth.

It is speculated that the diamond seed acts as a template whose surface dangling bonds ensure that the carbon atoms of the newly ruptured C—C bond of the $C_{70}$ molecule adopt the $sp^3$ hybridization required to continue the diamond growth. Ultimately all of the carbon atoms of the $C_{70}$ molecule could be incorporated into the diamond.

Metal carbonyls also exhibit an efficacy as catalysts for producing single crystal diamonds from $C_{70}$. In one study, 110 mg of $C_{70}$ a was placed in a glass capillary tube together with a small quantity of 1–3 $\mu$m mean diameter diamond powder which had previously been cleaned with ether, acetone, methanol, acetonitrile, toluene, acetone, water, nitric acid, HCl and water. The tube was evacuated and distilled iron carbonyl ($Fe(CO)_5$) was introduced to the level of the room temperature vapor pressure. The tube was sealed and baked at 580° C. for 150 days. Twelve diamond particles were recovered from the cell, each in excess of 0.1 mm mean diameter. These particles were identified as diamond using Raman spectroscopy and x-ray crystallography. Other metal carbonyls than iron also exhibit catalytic properties for growth of diamond from $C_{70}$ in addition to iron carbonyls other than the penta-carbonyl. The inventors reasonably believe the metal carbonyl is acting as a source of CO which may also be acting to catalyse diamond growth.

The present process is very advantageous since gem diamonds may be grown under low pressures and low temperatures for example in the range from about 400° C. to about 700° C. As discussed above, prior art methods for growing diamonds involve very high pressures and temperatures or expensive equipment for generating various kinds of energetic environments. The present method provides a very economical method of growing diamonds.

Although the process in accordance with the present invention occurs at relatively low temperatures and pressures, it makes use of the free energy stored in the $C_{70}$ molecule during its formation at the very high temperatures of the carbon arc used to generate it. This increase in free energy (over that of the graphite precursor in the form of the electrodes of the arc) manifests itself in the intermediate hybridization characteristic of the fullerenes. Recent theory predicts the involvement of a non-planar intermediate which has one $sp^3$ and one $sp$ hybridized carbon, see Robert L. Murray, Douglas L. Strout, Gregory K. Odom and Gustavo E. Scuseria, *Nature,* 366, 665–667 (1993).

In order to channel this free energy into diamond formation some of the C—C bonds in $C_{70}$, must be induce to rupture. This is achieved by the presence of materials such as selenium, phosphorous and the carbonyl catalysts containing CO that donate electrons to the $C_{70}$ and, therefore, facilitate bond breaking.

The present invention advantageously provides an economical method of growing diamonds from seed diamond particles with $C_{70}$ which does not require high pressures or temperatures as in the known methods. The result that $C_{70}$, but not $C_{60}$, can be readily reduced in the presence of a reducing agent was completely unexpected.

Therefore what is claimed is:

1. A process for growing diamonds, comprising;
   exposing diamond seed particles to vapor phase $C_{70}$ in the presence of a gas phase metal carbonyl at an effective temperature to cause at least some of the diamond seed particles to grow.

2. The process according to claim 1 wherein said gas phase metal carbonyl is selected from the group consisting of iron carbonyls.

3. The process according to claim 2 wherein said iron carbonyl is iron penta-carbonyl.

4. The process according to claim 1 wherein said metal carbonyl is iron penta-carbonyl.

5. The process according to claim 1 wherein the effective temperature is in the range from 400° C. to 700° C.

6. The process according to claim 2 wherein the effective temperature is in the range from 400° C. to 700° C.

7. The process according to claim 4 wherein the effective temperature is in the range from about 560° C. to about 600° C.

8. A process for growing diamonds, comprising;
   exposing diamond seed particles to vapor phase $C_{70}$ in the presence of a gas phase catalyst comprising at least CO constituent at an effective temperature to cause at least some of the diamond seed particles to grow.

9. The process according to claim 8 wherein said gas phase catalyst is selected from the group consisting of metal carbonyls.

10. The process according to claim 9 wherein said metal carbonyl is selected from the group consisting of iron carbonyls.

11. The process according to claim 10 wherein said iron carbonyl is $Fe(CO)_5$.

12. The process according to claim 8 wherein the effective temperature is in the range from 400° C. to 700° C.

13. The process according to claim 10 wherein the effective temperature is in the range from 400° C. to 700° C.

14. The process according to claim 11 wherein the effective temperature is in the range from about 560° C. to about 600° C.

15. A process for growing diamonds, comprising;
cleaning diamond seed particles and then exposing said diamond seed particles to vapor phase $C_{70}$ in the presence of a gas phase iron carbonyl at a temperature in the range from about 570° C. to about 600° C. to cause at least some of the diamond seed particles to grow.

16. The process according to claim 15 wherein said iron carbonyl is $Fe(CO)_5$.

* * * * *